(12) United States Patent
Kano et al.

(10) Patent No.: US 8,039,060 B2
(45) Date of Patent: Oct. 18, 2011

(54) BARRIER FILM SUBSTRATE AND METHOD FOR PRODUCING SAME, AND ORGANIC DEVICE

(75) Inventors: Kenji Kano, Kanagawa (JP); Yuya Agata, Kanagawa (JP)

(73) Assignee: Fujifilm Corporation, Tokyo (JP)

(*) Notice: Subject to any disclaimer, the term of this patent is extended or adjusted under 35 U.S.C. 154(b) by 436 days.

(21) Appl. No.: 12/178,346

(22) Filed: Jul. 23, 2008

(65) Prior Publication Data

US 2009/0029183 A1 Jan. 29, 2009

(30) Foreign Application Priority Data

Jul. 25, 2007 (JP) ................................. 2007-193293

(51) Int. Cl.
*H05H 1/00* (2006.01)
*B32B 27/00* (2006.01)

(52) U.S. Cl. ........................................ 427/535; 428/500

(58) Field of Classification Search .................. 427/535; 428/141, 323, 500, 535
See application file for complete search history.

(56) References Cited

U.S. PATENT DOCUMENTS

| 6,268,695 B1 | 7/2001 | Affinito |
| 2005/0202265 A1 | 9/2005 | Naruse et al. |
| 2008/0081205 A1* | 4/2008 | Agata et al. .................. 428/500 |

FOREIGN PATENT DOCUMENTS

| JP | 53-12953 | 2/1978 |
| JP | 58-217344 A | 12/1983 |
| JP | 2003-53881 A | 2/2003 |
| JP | 2004-9395 A | 1/2004 |

OTHER PUBLICATIONS

Database WPI Week 200634, Thomson Scientific, London, 2006-324542 XP002514833.
Database WPI Week 200748, Thomson Scientific, London, 2007-485779 XP002514834.

* cited by examiner

*Primary Examiner* — Frederick Parker
*Assistant Examiner* — Michael Wieczorek
(74) *Attorney, Agent, or Firm* — Birch, Stewart, Kolasch & Birch, LLP

(57) ABSTRACT

A method for producing a barrier film substrate with excellent gas-barrier capability having, on at least one surface of a plastic film, a barrier layer that contains at least one inorganic layer and at least one organic layer, which includes forming the organic layer by polymerization of a monomer mixture containing a vinyl monomer that has a sulfinyl group or a sulfonyl group and a tertiary carbon atom.

11 Claims, No Drawings

BARRIER FILM SUBSTRATE AND METHOD FOR PRODUCING SAME, AND ORGANIC DEVICE

BACKGROUND OF THE INVENTION

1. Field of the Invention

The present invention relates to a barrier film substrate having excellent gas-barrier capability. More precisely, the invention relates to a barrier film substrate favorably usable in various organic devices such as image display devices, in particular, to a barrier film substrate useful as a substrate for flexible organic electroluminescent devices (hereinafter referred to as "organic EL devices") and to a method for producing it, and also to an organic device.

2. Description of the Related Art

Heretofore, a barrier film laminate fabricated by forming a thin metal oxide film of aluminium oxide, magnesium oxide, silicon oxide or the like on the surface of a plastic substrate or a film is widely used for wrapping or packaging articles that require shielding from various gases such as water vapor or oxygen and for wrapping or packaging edibles, industrial articles and medicines for preventing them from being deteriorated. Apart from its applications for wrapping and packaging articles, in addition, the barrier film substrate is being used in liquid-crystal display devices, solar cells and EL devices.

In recent development of image display devices such as liquid-crystal display devices and EL devices, the transparent substrate to constitute these devices is required to be lightweight and has a large panel size and, in addition, it is further required to satisfy high-level requirements in that it has long-term reliability and has a lot of latitude in designing its shape and that it enables curved-face display. For the transparent substrate capable of satisfying such high-level requirements, a plastic substrate is being used as a new type of substrate substitutable for a conventional glass substrate that is heavy and readily cracked or broken and hardly worked into a large-size panel. Not only satisfying the above requirements, but also the plastic substrate is applicable to a roll-to-roll system, and therefore it is more advantageous than a glass substrate in that the producibility with it is high and the production cost with it is low.

However, the film substrate of transparent plastics or the like is problematic in that its gas-barrier property is inferior to that of a glass substrate. When a substrate having a poor gas-barrier property is used, water vapor and air may penetrate through it; and, for example, when it is used in liquid-crystal display devices, the liquid crystal in the liquid-crystal cell may be degraded and the degraded part may be a display failure, thereby worsening the display quality of the devices. For solving the problem, a barrier film substrate that comprises a thin metal oxide film formed on a film substrate has been developed. For example, as a barrier film substrate for use in wrapping materials and liquid-crystal display devices, there are known a plastic film coated with silicon oxide through vapor deposition (see JP-B 53-12953), and a plastic film coated with aluminium oxide through vapor deposition (see JP-A 58-217344). These have a water-vapor barrier level of 1 g/m²/day or so.

However, large-panel liquid-crystal display devices and high-definition display devices developed these days require plastic film substrates having a further improved gas-barrier capability, for example, having a water vapor permeability of at most 0.1 g/m²/day or so. Further recently, the development of organic EL display devices and high-definition color liquid-crystal display devices is being more promoted, and they require transparent substrates having a further improved barrier capability (especially having a water vapor permeability of less than 0.01 g/m²/day). To satisfy these requirements, some methods expected to produce a higher barrier level have been investigated, for example, a sputtering method of forming a thin film by the use of a plasma generated through glow discharge under low pressure, and a CVD method for film formation. In addition, also proposed is an organic light-emitting device provided with a barrier film having an alternate laminate structure of organic layer/inorganic layer fabricated according to a vacuum evaporation method (see U.S. Pat. No. 6,268,695 (page 4 [2-5] to page 5 [4-49])). Further, for giving the necessary folding resistance enough for application to flexible image displays to a plastic film, disclosed is a technique of using a polymer formed through polymerization of an acrylic monomer and having a volume shrinkage of less than 10% as an organic layer of the film (see JP-A 2003-53881 (page 3 [0006] to page 4 [0008])).

However, for use for flexible organic EL device substrates, they are still unsatisfactory in point of the adhesion between the organic layer/inorganic layer, and further improving them is desired. Given that situation, taken is a trial of using a resin crosslinked with a diacrylate having, as a polar group, an ether group as the organic layer thereby improving the adhesiveness of the organic layer to the inorganic layer to be laminated thereon (see JP-A 2004-9395 (page 3 [0005] to page 4 [0008], page 7 [0017] to [0022])); however, this is still insufficient in point of the gas-barrier capability necessary for organic EL devices.

SUMMARY OF THE INVENTION

The present invention has been made in consideration of the above-mentioned problems, and one object of the invention is to provide a barrier film substrate that has a sufficient water vapor-barrier property and is applicable to flexible organic EL devices and the like, and to provide a method for producing it. Another object of the invention is to provide an organic device of excellent durability, which comprises the barrier film substrate.

The present inventors have assiduously studied and, as a result, have found that, in a barrier film substrate comprising a barrier layer that contains an organic layer and an inorganic layer, when a monomer having a specific structure is used as the monomer for producing the polymer for use in forming the organic layer, then the adhesiveness of the formed barrier layer can be increased, and have completed the present invention described below.

[1] A method for producing a barrier film substrate having, on at least one surface of a plastic film, a barrier layer that contains at least one inorganic layer and at least one organic layer, which includes a step of forming the organic layer by polymerization of a monomer mixture containing a vinyl monomer that has a sulfinyl group or a sulfonyl group and a secondary carbon atom.

[2] The method for producing a barrier film substrate of [1], wherein the vinyl monomer is represented by the following formula (1):

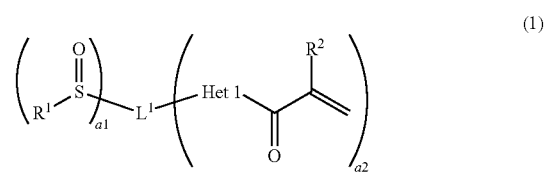

wherein R¹ represents an alkyl group, an aryl group, an aralkyl group or an alkylaryl group; R² represents a hydrogen atom or an alkyl group; L¹ represents a linking group; Het1 represents an oxygen atom or an imino group; a1 and a2 each independently indicate an integer of from 1 to 4; provided that the compound of formula (1) contains a secondary carbon atom in $R^1$ or $L^1$.

[3] The method for producing a barrier film substrate of [2], wherein Het1 in formula (1) is an oxygen atom.

[4] The method for producing a barrier film substrate of [2] or [3], wherein $R^2$ in formula (1) is a hydrogen atom.

[5] The method for producing a barrier film substrate of [1], wherein the vinyl monomer is represented by the following formula (2):

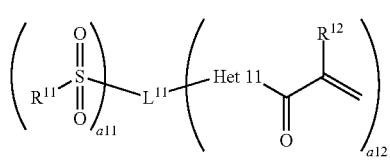

(2)

wherein $R^{11}$ represents an alkyl group, an aryl group, an aralkyl group or an alkylaryl group; $R^{12}$ represents a hydrogen atom or an alkyl group; $L^{11}$ represents a linking group; Het11 represents an oxygen atom or an imino group; a11 and a12 each independently indicate an integer of from 1 to 4; provided that the compound of formula (2) contains a secondary carbon atom in $R^{11}$ or $L^{11}$.

[6] The method for producing a barrier film substrate of [5], wherein in formula (2), at least one secondary carbon atom is positioned at the α-position or β-position relative to the sulfonyl group.

[7] The method for producing a barrier film substrate of [5] or [6], wherein Het11 in formula (2) is an oxygen atom.

[8] The method for producing a barrier film substrate of any one of [5] to [7], wherein $R^{11}$ in formula (2) is an alkyl group or an aryl group.

[9] The method for producing a barrier film substrate of any one of [5] to [8], wherein $R^{12}$ in formula (2) is a hydrogen atom.

[10] The method for producing a barrier film substrate of any one of [2] to [9], wherein the monomer mixture contains the vinyl monomer of formula (1) or (2) in an amount of from 1 to 80% by weight.

[11] The method for producing a barrier film substrate of any one of [1] to [10], wherein the inorganic layer is formed on the organic layer so that it is in contact with the organic layer.

[12] The method for producing a barrier film substrate of [11], wherein the inorganic layer is formed after plasma treatment of the surface of the organic layer.

[13] A barrier film substrate produced by the method of any one of [1] to [12].

[14] A barrier film substrate having, on at least one surface of a plastic film, a barrier layer that contains at least one inorganic layer and at least one organic layer, wherein the organic layer is a layer that contains a polymer having a structural unit of the following formula (3):

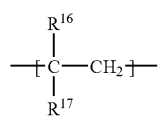

(3)

wherein $R^{16}$ represents a hydrogen atom or an alkyl group; $R^{17}$ represents a group having a sulfinyl group or a sulfonyl group and a secondary carbon atom.

[15] The barrier film substrate of [14], wherein the polymer has a structural unit of the following formula (4):

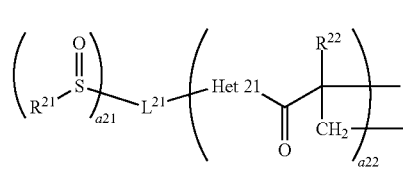

(4)

wherein $R^{21}$ represents an alkyl group, an aryl group, an aralkyl group or an alkylaryl group; $R^{22}$ represents a hydrogen atom or an alkyl group; $L^{21}$ represents a linking group; Het21 represents an oxygen atom or an imino group; a21 and a22 each independently indicate an integer of from 1 to 4; provided that the structural unit of formula (4) contains a secondary carbon atom in $R^{21}$ or $L^{21}$.

[16] The barrier film substrate of [15], wherein Het21 in formula (4) is an oxygen atom.

[17] The barrier film substrate of [15] of [16], wherein $R^{22}$ in formula (4) is a hydrogen atom.

[18] The barrier film substrate of [14], wherein the polymer has a structural unit of the following formula (5):

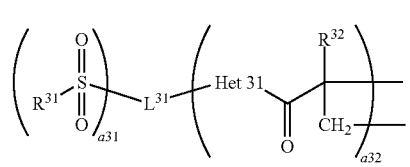

(5)

wherein $R^{31}$ represents an alkyl group, an aryl group, an aralkyl group or an alkylaryl group; $R^{32}$ represents a hydrogen atom or an alkyl group; $L^{31}$ represents a linking group; Het31 represents an oxygen atom or an imino group; a31 and a32 each independently indicate an integer of from 1 to 4; provided that the structural unit of formula (5) contains a secondary carbon atom in $R^{31}$ or $L^{31}$.

[19] The barrier film substrate of [18], wherein in formula (5), at least one secondary carbon atom is positioned at the α-position or β-position relative to the sulfonyl group.

[20] The barrier film substrate of [18] or [19], wherein Het31 in formula (5) is an oxygen atom.

[21] The barrier film substrate of any one of [18] to [20], wherein $R^{31}$ in formula (5) is an alkyl group or an aryl group.

[22] The barrier film substrate of any one of [18] to [21], wherein $R^{32}$ in formula (5) is a hydrogen atom.

[23] The barrier film substrate of any one of [14] to [22], wherein the polymer contains the structural unit of any of formulae (3) to (5) in an amount of from 1% by mass to 80% by mass.

[24] The barrier film substrate of any one of [14] to [23], which has the barrier layer on both surfaces of the plastic film.

[25] The barrier film substrate of any one of [14] to [24], which has, on the plastic film, at least two pairs of composite layers each consisting of an inorganic layer and an organic layer that are adjacent to each other.

[26] The barrier film substrate of any one of [14] to [25], which has a water vapor permeability at 40° C. and a relative humidity of 90% of less than 0.01 g/m$^2$/day.

[27] An organic device comprising the barrier film substrate of any one of [14] to [26].

[28] The organic device of [27], which is an organic EL device.

In the barrier film substrate of the invention, the barrier layer has high adhesiveness and has a low water vapor permeability. According to the production method of the invention, the barrier film substrate can be readily produced. Further, the organic device of the invention has high durability.

BEST MODE FOR CARRYING OUT THE INVENTION

The barrier film substrate and its production method and the organic device of the invention are described in detail hereinunder. The description of the constitutive elements of the invention given hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof.

[Barrier Film Substrate and its Production Method]

The barrier film substrate of the invention comprises a plastic film and, as formed thereon, a barrier layer that contains an organic layer and an inorganic layer. The barrier layer may be formed only on one surface of the plastic film or on both surfaces thereof.

(Plastic Film)

Not specifically defined, the plastic film for use in the invention may be suitably selected in accordance with the purpose of its use. Concretely, usable for it are polyesters, acrylic resins, methacrylic resins, methacrylic acid/maleic acid copolymers, polystyrenes, transparent fluororesins, polyimides, fluorinated polyimides, polyamides, polyamidimides, polyether imides, cellulose acylates, polyurethanes, polyether ether ketones, polycarbonates, alicyclic polyolefins, polyarylates, polyether sulfones, polysulfones, fluorene ring-modified polycarbonates, alicyclic-modified polycarbonates, fluorene ring-modified polyesters, acryloyl compounds and other thermoplastic resins.

Not specifically defined, the thickness of the plastic film may be suitably selected in accordance with the use thereof, but is typically from 1 to 800 μm, preferably from 10 to 200 μm.

The plastic film may have, on one surface or on both surfaces thereof, a functional layer such as a transparent conductive layer, a primer layer. The functional layer is described in detail in JP-A 2006-289627, paragraphs [0036] to [0038]. Examples of other functional layers than the above are a mat agent layer, a protective layer, an antistatic layer, a leveling layer, an adhesiveness improving layer, a light shielding layer, an antireflection layer, a hard coat layer, a stress relaxing layer, an antifogging layer, an antisoiling layer, a printable layer.

(Organic Layer)

The organic layer is preferably a polymer of a monomer mixture comprising an acrylate or methacrylate as the main ingredient. The monomer mixture for use in the production method of the invention is characterized by containing a vinyl monomer having a sulfinyl group or a sulfonyl group. The vinyl monomer further has a secondary carbon atom along with the sulfinyl group or the sulfonyl group. The sulfinyl group-having vinyl monomer for use in the production method of the invention is described in the following.

The vinyl monomer having a sulfinyl group and a secondary carbon atom may be any one having a vinyl group, a sulfinyl group and a secondary carbon atom in the molecule, and the other structure thereof is not specifically defined. As the sulfinyl group-having vinyl monomer, preferred are those having a structure of the following formula (1):

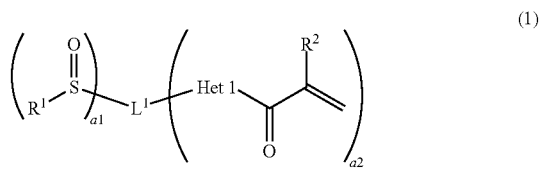

In formula (1), $R^1$ represents an alkyl group, an aryl group, an aralkyl group or an alkylaryl group; $R^2$ represents a hydrogen atom or an alkyl group; $L^1$ represents a linking group; Het1 represents an oxygen atom or an imino group; a1 and a2 each independently indicate an integer of from 1 to 4; provided that the compound of formula (1) contains a secondary carbon atom in $R^1$ or $L^1$.

In formula (1), $R^1$ represents an alkyl group (for example, an alkyl group having from 1 to 20 carbon atoms), an aryl group (for example, an aryl group having from 6 to 20 carbon atoms), an aralkyl group (for example, an aralkyl group having from 7 to 20 carbon atoms) or an alkylaryl group (for example, an alkylaryl group having from 7 to 20 carbon atoms); $R^2$ represents a hydrogen atom or an alkyl group (for example, an alkyl group having from 1 to 20 carbon atoms). Preferably, $R^1$ is an alkyl group or an aryl group; and preferably, $R^2$ is a hydrogen atom.

Examples of the alkyl group having from 1 to 20 carbon atoms include a methyl group, an ethyl group, an n-propyl group, an i-propyl group, a butyl group (e.g., n-butyl group, i-butyl group, tert-butyl group, sec-butyl group), a pentyl group (e.g., n-pentyl group, i-pentyl group, neopentyl group, cyclopentyl group), a hexyl group (e.g., n-hexyl group, i-hexyl group, cyclohexyl group), a heptyl group (e.g., n-heptyl group, i-heptyl group), an octyl group (e.g., n-octyl group, i-octyl group, tert-octyl group), a nonyl group (e.g., n-nonyl group, i-nonyl group), a decyl group (e.g., n-decyl group, an i-decyl group), an undecyl group (e.g., n-undecyl group, i-undecyl group), a dodecyl group (e.g., n-dodecyl group, i-dodecyl group). In consideration of the balanced operability in shaping the polymer, preferred is an alkyl group having from 1 to 16 carbon atoms, and more preferred is an alkyl group having from 1 to 12 carbon atoms.

Examples of the aryl group having from 6 to 20 carbon atoms include a phenyl group, a naphthyl group. The number of the carbon atoms constituting the group is preferably from 6 to 14, more preferably from 6 to 10, even more preferably from 6 to 8.

Examples of the aralkyl group having from 7 to 20 carbon atoms include those derived from an alkyl group having from 1 to 14 carbon atoms, preferably from 1 to 8 carbon atoms by substituting at least one hydrogen atom thereof with an aryl group; and preferred examples are a benzyl group, a phenethyl group. The number of the carbon atoms constituting the aralkyl group is preferably from 7 to 15, more preferably from 7 to 11, even more preferably from 7 to 9.

Examples of the alkylaryl group having from 7 to 20 carbon atoms include those derived from an aryl group having from 6 to 18 carbon atoms by substituting at least one hydrogen atom thereof with an alkyl group having from 1 to 14 carbon atoms, preferably from 1 to 8 carbon atoms; and preferred examples are a phenyl group, a tolyl group, a xylyl group.

$L^1$ represents an (a1+a2)-valent linking group. Examples of the divalent $L^1$ group are a single bond, an oxygen atom, a sulfur atom, a carbonyl group, an alkylene group (e.g., methylene group, ethylene group, propylene group, butylene group, pentylene group, hexylene group), an arylene group (e.g., phenylene group, naphthylene group), or a group formed by bonding a plurality of such divalent groups in series (e.g., alkylene-arylene group, alkyleneoxy group, alkyleneoxy-alkylene group, alkyleneoxy-carbonyl group, aryleneoxy-carbonyl group, carboxyalkyleneoxy group, carboxyalkyleneoxy-carbonyl group). Examples of the trivalent to hexavalent $L^1$ group includes linking groups derived from the above-mentioned examples of the divalent $L^1$ group by removing from 1 to 3 hydrogen atoms from them. The sum of a1 and a2 varies depending on the valence of the linking group. For the divalent linking group, it is 2; for the trivalent linking group, it is 3; for the tetravalent linking group, it is 4; and for the hexavalent linking group, it is 5. $R^1$ and $L^1$ may bond to each other to form a ring.

a1 is preferably 1 or 2, more preferably 1. a2 is preferably 1 or 2, more preferably 1. a1+a2 is preferably from 2 to 4, more preferably 2.

Het1 represents an oxygen atom or an imino group (e.g., imino group, alkylimino group, arylimino group). Preferably, Het1 is an oxygen atom.

The compound of formula (1) must contain a secondary carbon atom in $R^1$ or $L^1$. Preferably, in formula (1), at least one secondary carbon atom is positioned in the α- or β-position relative to the sulfinyl group.

Specific examples of the vinyl monomer of formula (1) are shown below; however, the vinyl monomer of formula (1) usable in the invention should not be limited to these.

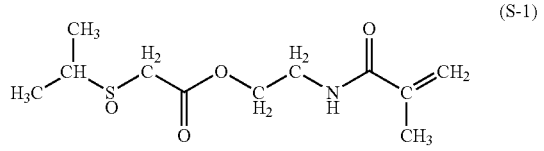
(S-1)

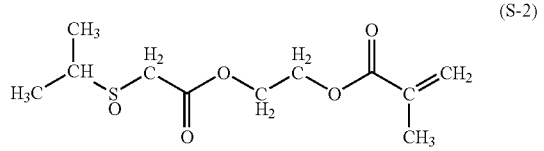
(S-2)

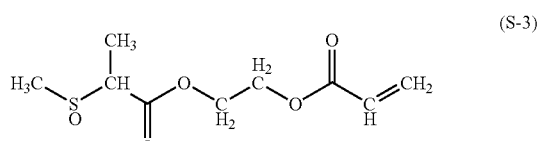
(S-3)

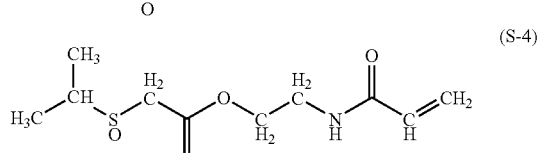
(S-4)

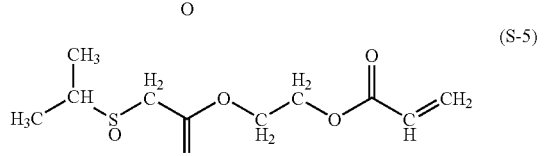
(S-5)

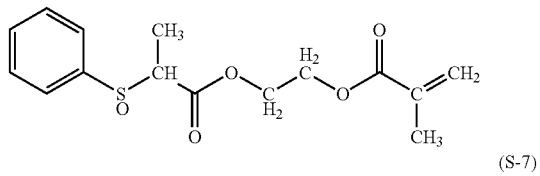
(S-6)

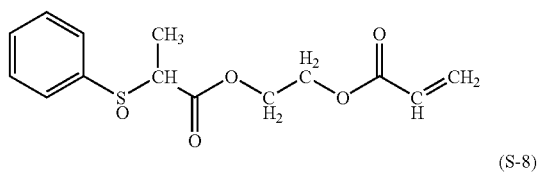
(S-7)

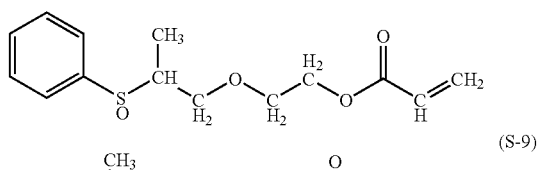
(S-8)

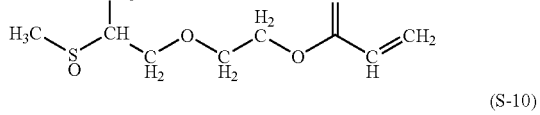
(S-9)

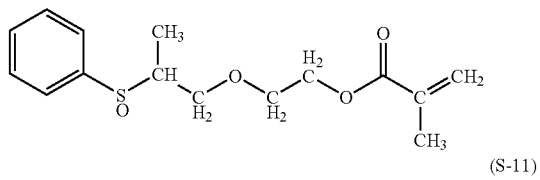
(S-10)

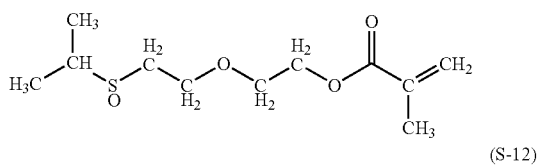
(S-11)

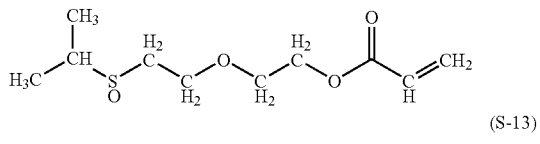
(S-12)

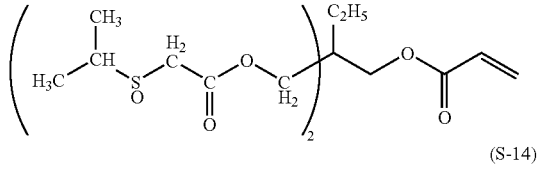
(S-13)

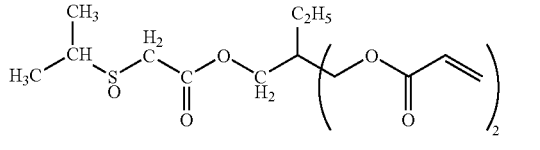
(S-14)

The vinyl monomer having a sulfonyl group and a secondary carbon atom for use in the invention may be any one having a vinyl group, a sulfonyl group and a secondary carbon atom in the molecule, and the other structure thereof is not specifically defined. As the sulfonyl group-having vinyl monomer, preferred are those having a structure of the following formula (2):

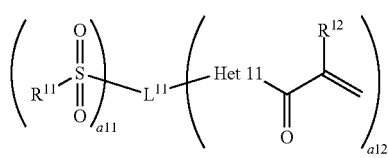
(2)

In formula (2), $R^{11}$ represents an alkyl group, an aryl group, an aralkyl group or an alkylaryl group; $R^{12}$ represents a hydrogen atom or an alkyl group; $L^{11}$ represents a linking group; Het11 represents an oxygen atom or an imino group; a11 and a12 each independently indicate an integer of from 1 to 4.

In formula (2), the detailed description and the preferred range of $R^{11}$, $R^{12}$, $L^{11}$, Het11, a11 and a12 are the same as the detailed description and the preferred range of $R^1$, $R^2$, $L^1$, Het1, a1 and a2 in formula (1) mentioned above.

The compound of formula (2) must contain a secondary carbon atom in $R^{11}$ or $L^{11}$. In formula (2), preferably, at least one secondary carbon atom is positioned in the α- or β-position relative to the sulfonyl group.

Specific examples of the vinyl monomer of formula (2) are shown below; however, the vinyl monomer of formula (2) for use in the invention should not be limited to these.

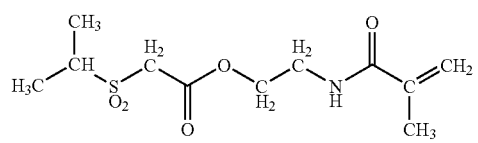
(T-1)

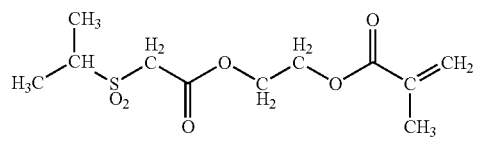
(T-2)

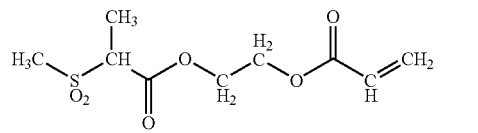
(T-3)

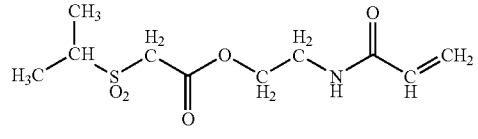
(T-4)

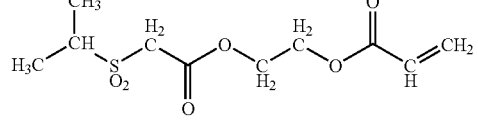
(T-5)

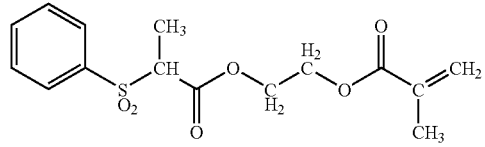
(T-6)

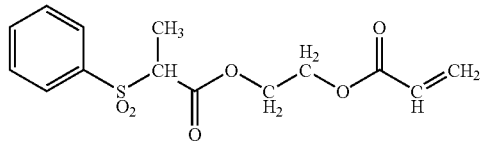
(T-7)

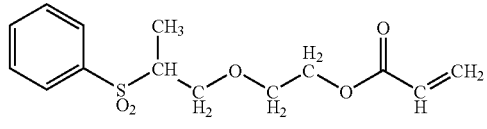
(T-8)

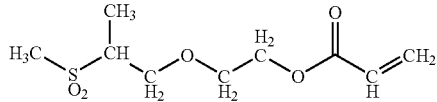
(T-9)

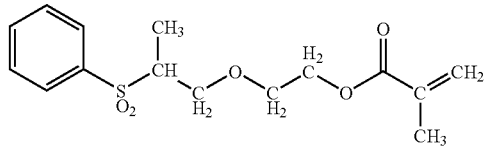
(T-10)

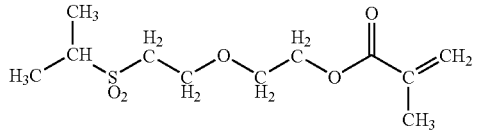
(T-11)

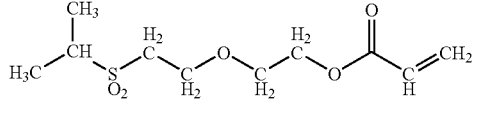
(T-12)

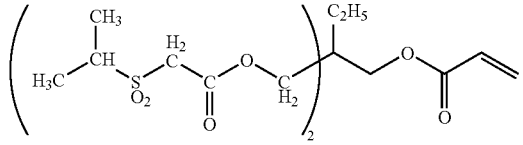
(T-13)

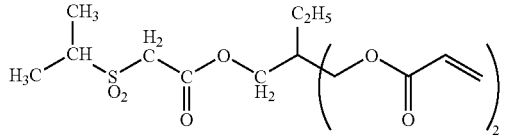
(T-14)

Preferably, the monomer mixture contains any other monomer in addition to the above-mentioned sulfinyl group or sulfonyl group-having vinyl monomer. The other monomer is preferably an acrylate and a methacrylate. The acrylate and the methacrylate that may be in the monomer mixture includes acrylates and methacrylates having an alkyl group, a cycloalkyl group, a bicycloalkyl group, an aryl group, a perfluoroalkyl group, a perfluoroaryl group, an alkoxy group, an aryloxy group, a polyalkyleneoxy group, a cyano group, an amino group, an alkoxycarbonyl group, a phosphoryl group, a phosphoric acid group, a phosphate group, a hydroxyl group, a carboxyl group, or a combination of two or more those groups. Especially preferred are acrylates and methacrylates having a phosphoric acid group or a phosphate group. The acrylate and the methacrylate that may be in the monomer mixture may not be monofunctional but may be bifunctional, trifunctional, tetrafunctional or more multifunctional. For example, a combination of a bifunctional monomer and a trifunctional monomer may be used herein.

Specific examples of the acrylates and methacrylates that may be used in the invention are shown below; to which, however, the invention should not be limited.

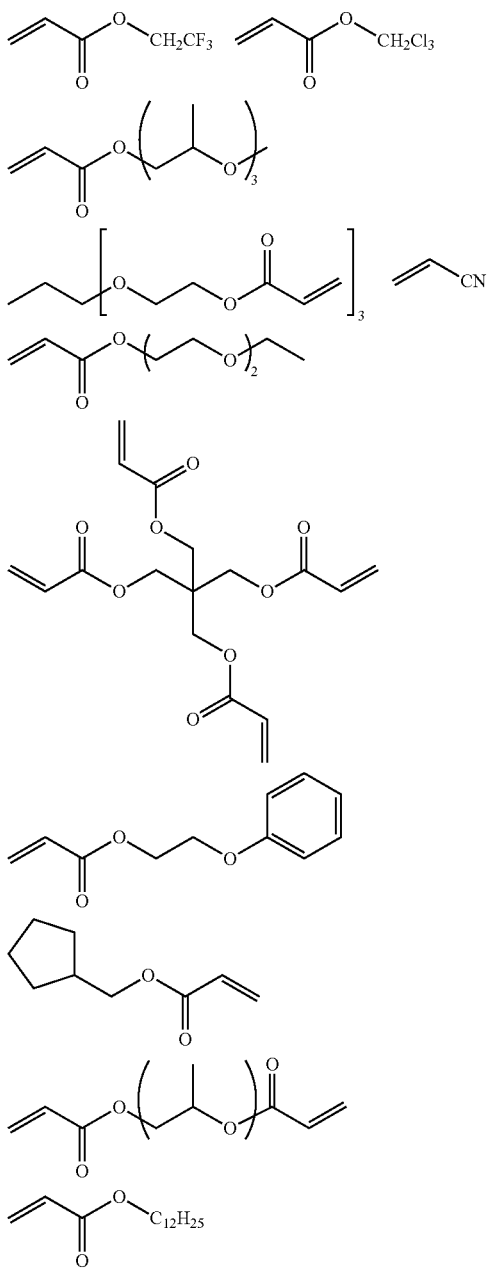

Apart from the above, monomers commercially available in Japan are also usable in the monomer mixture.

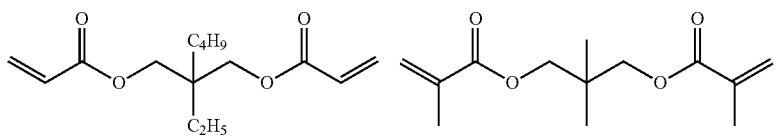

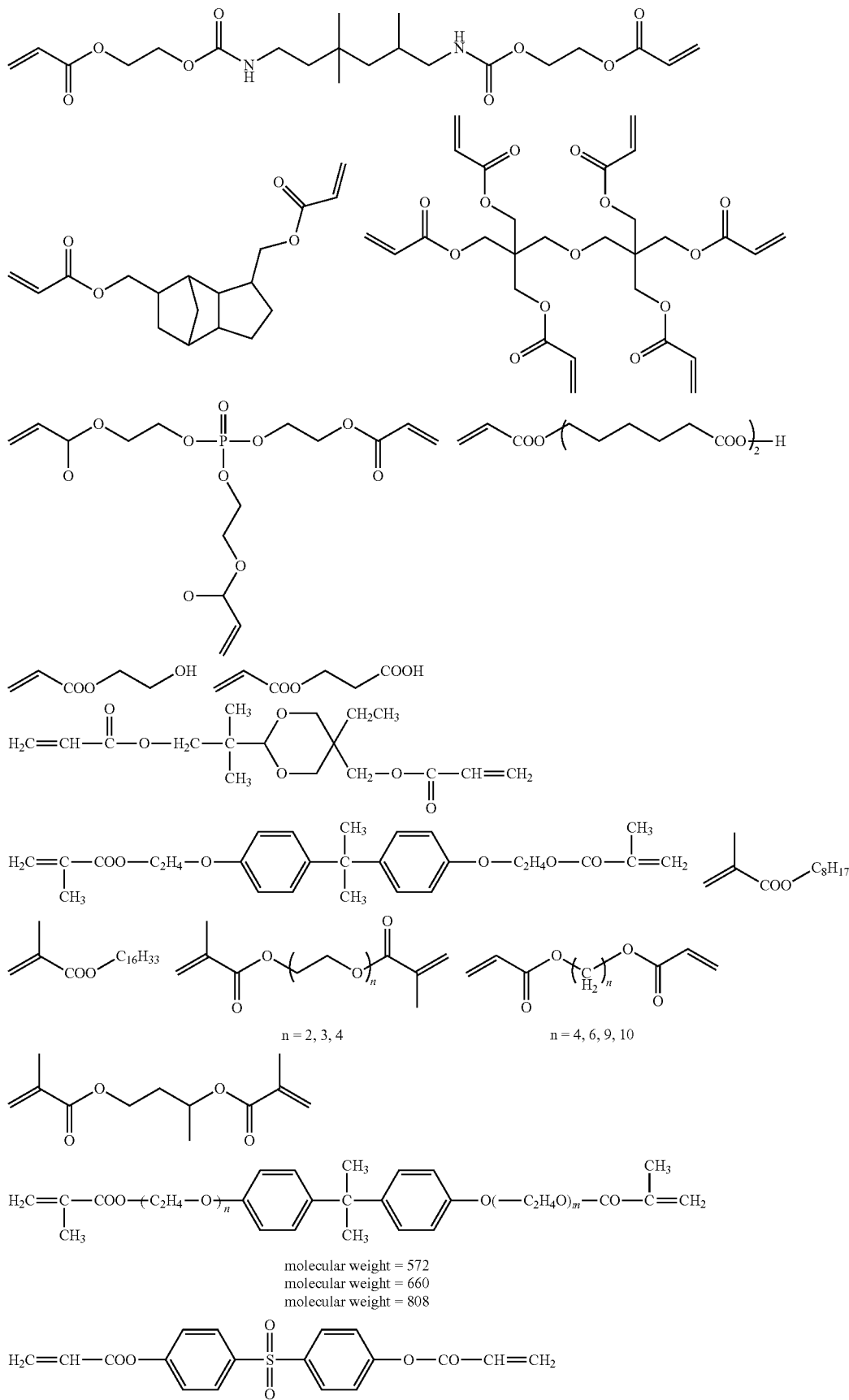

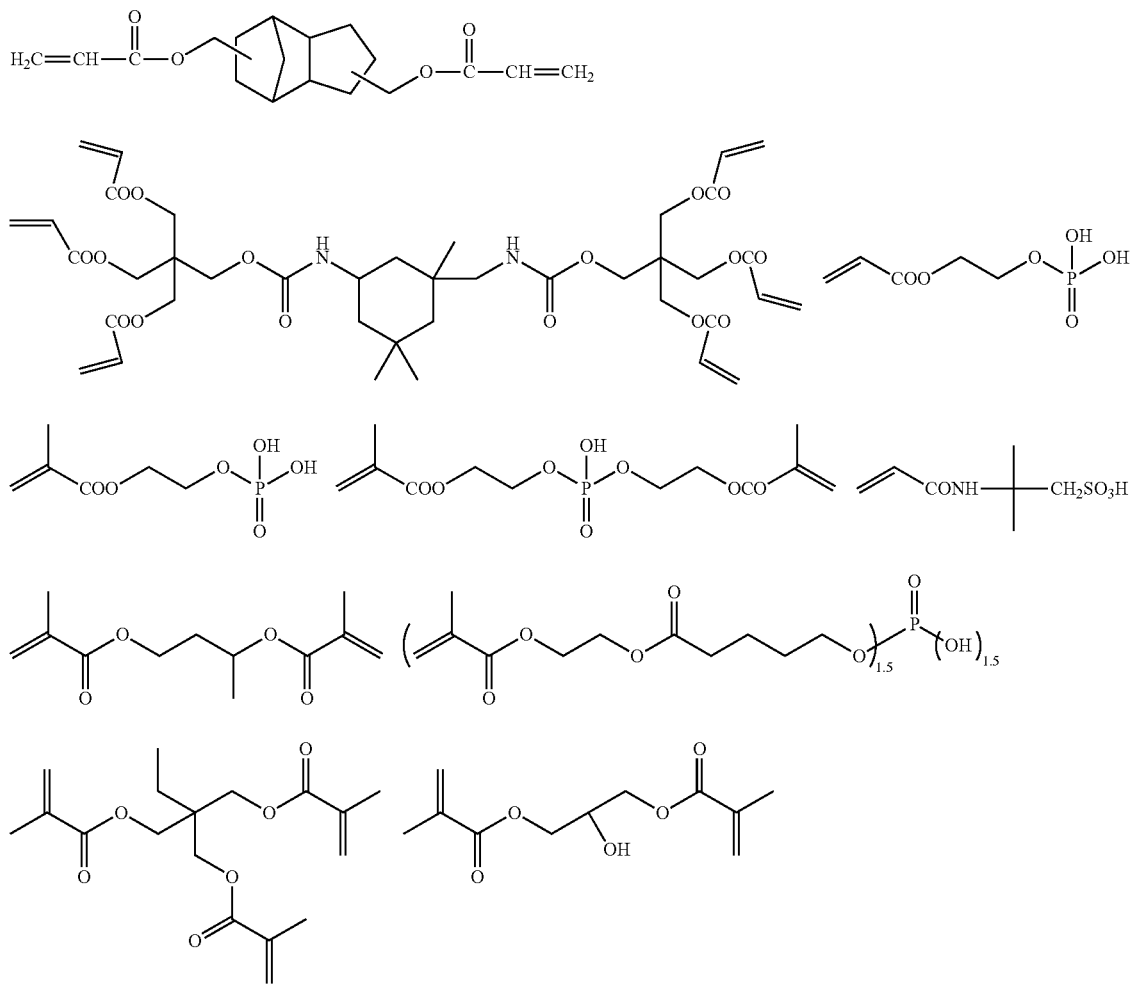

The monomer mixture for use in the invention may contain one or more different types of sulfinyl group or sulfonyl group-having vinyl monomers, either singly or as combined. In case where it contains two or more different types of the monomers as combined, then it may contain two or more different types of sulfinyl group-having monomers as combined, or two or more different types of sulfonyl group-having monomers as combined, or may contain at least one type of a sulfinyl group-having monomer and at least one type of a sulfonyl group-having monomer as combined. The monomer mixture may also contain one or more other monomers either singly or as combined.

Preferably, the monomer mixture contains a sulfinyl group or sulfonyl group-having vinyl monomer in an amount of from 1 to 80% by weight, more preferably from 5 to 70% by mass, even more preferably from 10 to 50% by mass, still more preferably from 15 to 30% by mass.

The method for polymerizing the monomer mixture is not specifically defined, for which, for example, preferred is thermal polymerization, photopolymerization (by UV rays or visible rays), electron beam polymerization, plasma polymerization or their combination. Of those, especially preferred is photopolymerization. In photopolymerization, used is a photopolymerization initiator. Examples of the photopolymerization initiator are Ciba Specialty Chemicals' commercial products, Irgacure series (e.g., Irgacure 651, Irgacure 754, Irgacure 184, Irgacure 2959, Irgacure 907, Irgacure 369, Irgacure 379, Irgacure 819), Darocure series (e.g., Darocure TPO, Darocure 1173), Qantacure PDO; and Sartomer's commercial products, Ezacure series (e.g., Ezacure TZM, Ezacure TZT).

The light for irradiation is generally UV light from high-pressure mercury lamp or low-pressure mercury lamp. The irradiation energy is preferably at least 0.5 J/cm$^2$, more preferably at least 2 J/cm$^2$. Acrylates and methacrylates receive polymerization inhibition by oxygen in air, and therefore the oxygen concentration or the oxygen partial pressure during polymerization is preferably low. In case where the oxygen concentration in polymerization is lowered according to a nitrogen purging method, the oxygen concentration is preferably at most 2%, more preferably at most 0.5%. In case where the oxygen partial pressure is lowered according to a pressure reduction method, the total pressure is preferably at most 1000 Pa, more preferably at most 100 Pa. Especially preferred is UV polymerization with irradiation at 2 J/cm$^2$ or more under a reduced pressure condition of at most 100 Pa.

In forming the organic layer of the barrier film substrate of the invention, employable is an ordinary solution coating method or a vacuum film formation method. The solution coating method includes, for example, a dip coating method, an air knife coating method, a curtain coating method, a roller coating method, a wire bar coating method, a gravure coating method, a slide coating method, or an extrusion coating method of using a hopper as in U.S. Pat. No. 2,681,294. Not specifically defined, the vacuum film formation method is preferably a flash evaporation method as in U.S. Pat. Nos. 4,842,893, 4,954,371 or 5,032,461.

The organic layer of the barrier film substrate of the invention contains a polymer that has a structural unit of the following formula (3):

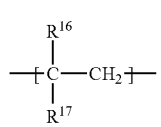
(3)

In formula (3), $R^{16}$ represents a hydrogen atom or an alkyl group; $R^{17}$ represents a group having a sulfinyl group or a sulfonyl group and a secondary carbon atom. Specific examples of $R^{16}$ are a hydrogen atom and a methyl group, and preferred is a hydrogen atom. Preferably, $R^{17}$ contains a group $R^{12}$—SO— or a group $R^{19}$—SO$_2$—. In this, $R^{18}$ and $R^{19}$ each independently represent an alkyl group, an aryl group, an aralkyl group or an alkylaryl group; and their specific examples and preferred range are the same as the specific examples and the preferred range of $R^1$ in formula (1) mentioned in the above.

More preferably, the organic layer of the barrier film substrate of the invention contains a polymer that has a structural unit of the following formula (4):

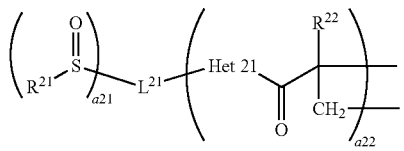
(4)

In formula (4), $R^{21}$ represents an alkyl group, an aryl group, an aralkyl group or an alkylaryl group; $R^{22}$ represents a hydrogen atom or an alkyl group; $L^{21}$ represents a linking group; Het21 represents an oxygen atom or an imino group; a21 and a22 each independently indicate an integer of from 1 to 4; provided that the structural unit of formula (4) contains a secondary carbon atom in $R^{21}$ or $L^{21}$. In formula (4), specific examples and the preferred range of $R^{21}$, $R^{22}$, $L^{21}$, Het21, a21 and a22 are the same as the preferred examples and the preferred range of $R^1$, $R^2$, $L^1$, Het1, a1 and a2 in formula (1) mentioned above.

Still more preferably, the organic layer of the barrier film substrate of the invention contains a polymer that has a structural unit of the following formula (5):

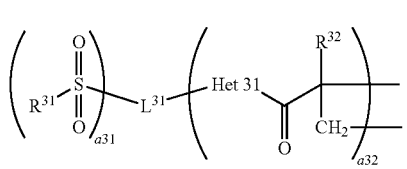
(5)

In formula (5), $R^{31}$ represents an alkyl group, an aryl group, an aralkyl group or an alkylaryl group; $R^{32}$ represents a hydrogen atom or an alkyl group; $L^{31}$ represents a linking group; Het31 represents an oxygen atom or an imino group; a31 and a32 each independently indicate an integer of from 1 to 4; provided that the structural unit of formula (5) contains a secondary carbon atom in $R^{31}$ or $L^{31}$.

Preferably, the polymer contains the structural unit of formula (3), (4) or (5) in an amount of from 1 to 80% by mass, more preferably from 5 to 70% by mass, even more preferably from 10 to 50% by mass, still more preferably from 15 to 30% by mass.

Any other polymer may be mixed in the organic layer of the barrier film substrate of the invention. Examples of the other polymer are polyesters, methacrylic acid/maleic acid copolymers, polystyrenes, transparent fluororesins, polyimides, fluorinated polyimides, polyamides, polyamidimides, polyether imides, cellulose acylates, polyurethanes, polyether ether ketones, polycarbonates, alicyclic polyolefins, polyarylates, polyether sulfones, polysulfones, fluorene ring-modified polycarbonates, alicyclic-modified polycarbonates, fluorene ring-modified polyesters.

The thickness of the organic layer is not specifically defined; however, when too thin, the layer could hardly have a uniform thickness, but when too thick, the layer may be cracked by external force thereby detracting from the barrier property of the film substrate. From these viewpoints, the thickness of the organic layer is preferably from 50 nm to 2000 nm, more preferably from 200 nm to 1500 nm.

Preferably, the organic layer thus formed is smooth. Regarding the smoothness of the organic layer, its Ra value as measured through AFM is preferably at most 10 nm, more preferably at most 5 nm, even more preferably at most 2 nm. In the invention, the organic layer may be a two-layered or more multi-layered laminate. In this case, the composition and the thickness of each constitutive layer may be the same or different.

Preferably, the surface of the organic layer is processed for surface treatment of plasma treatment, UV ozone treatment or corona treatment. Of those, especially preferred is plasma treatment, and most preferred is oxygen plasma treatment. Preferred conditions for the plasma treatment are that the inner pressure is 0.5 Pa (argon/oxygen=9/1) and the power is 50 W. The plasma treatment further enhances the adhesiveness between the organic layer and the inorganic layer adjacent thereto.

(Inorganic Layer)

The inorganic layer is generally a thin film layer of a metal compound. For forming the inorganic layer, employable is any method capable of forming the intended thin film. For it, for example, suitable are a coating method, a sputtering method, a vacuum evaporation method, an ion plating method, a plasma CVD method, etc. Concretely, the film formation methods described in Japanese Patent 3400324, JP-A 2002-322561 and 2002-361774 are employable herein.

The ingredients constituting the inorganic layer are not specifically defined so far as they satisfy the above-mentioned properties. For example, herein employable are oxides, nitrides or oxinitrides containing at least one metal selected from Si, Al, In, Sn, Zn, Ti, Cu, Ce, Ta and the like. Of those, more preferred are oxides, nitrides or oxinitrides of a metal selected from Si, Al, In, Sn, Zn or Ti; and even more preferred are oxides, nitrides or oxinitrides of a metal selected from Si or Al. These may contain any other element as a side ingredient.

Not specifically defined, the thickness of the inorganic layer preferably falls within a range of from 5 nm to 500 nm, more preferably from 10 nm to 200 nm. Two or more inorganic layers may be laminated. In this case, the constitutive layers may have the same or different composition.

For forming the inorganic layer, employable are various physical vapor deposition (PVD) methods such as evaporation method, sputtering method or ion plating method, various chemical vapor deposition (CVD) methods, and liquid-phase growth methods such as plating method or sol-gel method. Of those, preferred are chemical vapor deposition (CVD) methods and physical vapor deposition (PVD) methods since the influence of heat on the plastic film in inorganic layer formation thereon may be readily evaded, the production speed is high and a uniform thin film layer may be readily produced.

The barrier film substrate of the invention may have various functional layers in addition to the inorganic layer and the organic layer. Examples of the functional layers are optical functional layers such as an antireflection layer, a polarizing layer, a color filter and a light take-out efficiency-improving layer; mechanical functional layers such as a hard coat layer and a stress relaxation layer; electric functional layers such as an antistatic layer and a conductive layer; an antifogging layer; an antisoiling layer; and a printable layer. These functional layers may be formed between any of the plastic film, the inorganic layer, the UV-shielding layer and the organic layer; and may also be formed on the side of the substrate film opposite to the side thereof having the inorganic layer formed thereon.

(Constitution of Barrier Layer)

The barrier layer contains at least one organic layer and at least one inorganic layer. In general, an organic layer and an inorganic layer are laminated alternately. From the side of the plastic film, an inorganic layer and an organic layer may be laminated in that order; or an organic layer and an inorganic layer may be in that order. The uppermost layer of the barrier layer may be an inorganic layer or an organic layer. Preferably, the barrier film substrate of the invention has at least two pairs of composite layers each composed of an inorganic layer and an organic layer that are adjacent to each other. The barrier film substrate of the invention may have an additional functional layer on the barrier layer. The barrier film substrate of the invention may have a barrier layer formed on one surface of a plastic film, or may have a barrier layer formed on both surfaces thereof.

In case where the inorganic layer is formed according to a vacuum film formation method such as a sputtering method, a vacuum evaporation method, an ion plating method or a plasma CVD method, it is desirable that the organic layer is formed also according to a vacuum film formation method such as a flash vapor evaporation method. During the formation of the barrier layer, preferably, the system is not restored to atmospheric pressure during the course of the formation, and the organic layer and the inorganic layer are laminated all the time in a vacuum of at most 100 Pa. The pressure is more preferably at most 10 Pa, even more preferably at most 1 Pa. In lamination of the organic layer and the inorganic layer, the organic layer may be first formed on the support and then the inorganic layer may be formed thereon; but preferably, the organic layer is first formed on the support.

The barrier film substrate of the invention that has the barrier layer containing an inorganic layer and an organic layer may have a water vapor permeability at 40° C. and a relative humidity of 90% of less than 0.01 g/m$^2$/day. Another characteristic of the barrier film substrate is that its wet heat storability is good.

[Organic Device]

The barrier film substrate of the invention is favorably used in an organic device. In particular, the barrier film substrate of the invention is favorably used as a substrate of an organic device. The organic device as referred to in the invention includes, for example, image display devices such as circularly polarizing plate-having liquid-crystal display devices, electronic papers and organic EL devices. The applications of the barrier film substrate of the invention are not specifically defined. For example, it is favorably used as a substrate or a sealing film for these display devices.

(Circularly-Polarizing Plate)

A circularly-polarizing plate may be produced by laminating a λ/4 plate and a polarizer on the barrier film substrate of the invention. In this case, the two are so laminated that the slow axis of the λ/4 plate could be at 45° to the absorption axis of the polarizer. The polarizer is preferably stretched in the 45° direction relative to the machine direction (MD); and for example, those described in JP-A 2002-865554 are preferably used.

(Liquid-Crystal Display Device)

A liquid-crystal display device may be grouped into a reflection-type liquid-crystal display device and a transmission-type liquid-crystal display device. The reflection-type liquid-crystal display device has a constitution of a lower substrate layer, a reflection electrode, a lower alignment film, a liquid-crystal layer, an upper alignment film, a transparent electrode, an upper substrate, a λ/4 plate and a polarizing film in that order from the bottom. The barrier film substrate of the invention may be used as the transparent electrode and the upper substrate. In case where the reflection-type liquid-crystal display device is modified to have a color display function, preferably, a color filter layer is disposed between the reflection electrode and the lower alignment film or between the upper alignment film and the transparent electrode.

The transmission-type liquid-crystal display device has a constitution of a backlight, a polarizer, a λ/4 plate, a lower transparent electrode, a lower alignment film, a liquid-crystal layer, an upper alignment film, an upper transparent electrode, an upper substrate, a λ/4 plate and a polarizing film in that order from the bottom. The barrier film substrate of the invention may be used as the upper transparent electrode and the upper substrate. In case where the transmission-type liquid-crystal display device is modified to have a color display function, preferably, a color filter layer is disposed between the lower transparent electrode and the lower alignment film, or between the upper alignment film and the upper transparent electrode.

The structure of the liquid-crystal layer is not specifically defined. For example, it is preferably a TN (twisted nematic) mode, an STN (super-twisted nematic) mode, a HAN (hybrid aligned nematic) mode, a VA (vertically alignment) mode, an ECB (electrically controlled birefringence) mode, an OCB (optically compensatory bend) mode, or a CPA (continuous pinwheel alignment) mode.

(Organic EL Device with Barrier Film Substrate)

The barrier film substrate of the invention is favorably used in an organic EL device. The organic EL device comprising a barrier film substrate is described in detail in JP-A 2007-30387.

(Photovoltaic Cell)

The barrier film substrate of the invention is favorably used as a sealing film for a photovoltaic cell device. The barrier film substrate of the invention is preferably sealed through an adhesive layer. The photovoltaic cell devices to which the barrier film substrate of the invention is applied are not specifically limited.

EXAMPLES

The characteristics of the invention are described more concretely with reference to the following Examples. In the following Examples, the material used, its amount and the ratio, the details of the treatment and the treatment process may be suitably modified or changed not overstepping the sprit and the scope of the invention. Accordingly, the invention should not be limitatively interpreted by the Examples mentioned below.

1. Production and Evaluation of Barrier Film Substrate (1):

In this, a barrier film substrate was produced and evaluated, using a vinyl monomer having a sulfinyl group and a secondary carbon atoms.

A first inorganic layer, a first organic layer, a second inorganic layer, a second organic layer, a third inorganic layer, a third organic layer and a fourth inorganic layer were formed on a plastic film, thereby producing a barrier film substrate (samples 1 to 5) according to the process mentioned below. The details of each sample are shown in Table 1.

(1) Production of Barrier Film Substrate:

(1-1) Formation of First Inorganic Layer:

Using a sputtering apparatus, a first inorganic layer (aluminium oxide) was formed on a polyethylene naphthalate film (Teijin DuPont's trade name, Teonex Q65FA having a thickness of 125 μm). Aluminium was used as the target, argon was as the discharge gas and oxygen was as the reaction gas. The film formation pressure was 0.1 Pa, and the ultimate film thickness was 50 nm.

(1-2) Formation of First Organic Layer:

Onto the first inorganic layer formed on the plastic film, applied was a mixture solution of 20 g of a monomer having the composition as in Table 1, 0.6 g of a UV polymerization initiator (Ciba Specialty Chemicals' trade name, Ciba Irgacure 907) and 200 g of 2-butanone to a liquid thickness of 5 μm, using a wire bar. This was dried at room temperature for 2 hours, then cured through irradiation with UV rays from a high-pressure mercury lamp (total irradiation dose, about 2 J/cm$^2$) thereby forming a first organic layer. In every case, the film thickness was about 500 nm.

The sample 4 and the sample 5 were processed for plasma treatment of the organic layer. The plasma treatment was attained, using a sputtering apparatus at an inner pressure of 0.5 Pa (argon/oxygen=9/1) and a power of 50 W for 5 minutes.

(1-3) Formation of Second Inorganic Layer:

A second inorganic layer was formed on the first organic layer according to the same process as that for the first inorganic layer.

(1-4) Formation of Second Organic Layer:

A second organic layer was formed on the second inorganic layer according to the same process as that for the first organic layer. The sample 4 and the sample 5 were processed for plasma treatment like in the formation of the first organic layer.

(1-5) Formation of Third Inorganic Layer:

A third inorganic layer was formed on the second organic layer according to the same process as that for the first inorganic layer.

(1-6) Formation of Third Organic Layer:

A third organic layer was formed on the third inorganic layer according to the same process as that for the first organic layer. The sample 4 and the sample 5 were processed for plasma treatment like in the formation of the first organic layer.

(1-7) Formation of Fourth Inorganic Layer:

A fourth inorganic layer was formed on the third organic layer according to the same process as that for the first inorganic layer.

TABLE 1

| Sample No. | Monomer used in organic layer (amount used) | | | Plasma Treatment | Remarks |
|---|---|---|---|---|---|
| 1 | BEPGA (85 mas. %) | TMPTA (15 mas. %) | | no | comparative sample |
| 2 | BEPGA (75.5 mas. %) | TMPTA (14.5 mas. %) | S-3 (10 mas. %) | no | sample of the invention |
| 3 | BEPGA (66 mas. %) | TMPTA (14 mas. %) | S-3 (20 mas. %) | no | sample of the invention |
| 4 | BEPGA (75.5 mas. %) | TMPTA (14.5 mas. %) | S-3 (10 mas. %) | yes | sample of the invention |
| 5 | BEPGA (66 mas. %) | TMPTA (14 mas. %) | S-3 (20 mas. %) | yes | sample of the invention |

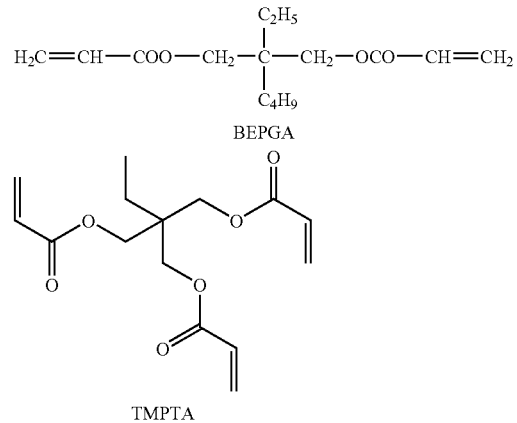

BEPGA

TMPTA (2) Evaluation of Physical Properties of Barrier Film Substrate:

The physical properties of the barrier film substrates (samples 1 to 5) were evaluated according to the methods mentioned below.

(2-1) Water Vapor Permeability:

Using a water vapor permeation meter (MOCON's PERMATRAN-W3/31), the water vapor permeability of each sample was determined at 40° C. and a relative humidity of 90%. The detection limit in this test was 0.01 g/m$^2$/day.

(2-2) Adhesiveness:

The adhesiveness of the barrier layer was determined according to the method of JIS K5600-5-6 (ISO2409) (cross-cut peel method). The data are the ratio of the area with no broken film (percentage).

(2-3) Results:

The results are shown in Table 2.

TABLE 2

| Sample No. | Content of Sulfinyl Group-Having Vinyl Monomer (%) | Presence or Absence of Plasma Treatment of Organic Layer | Water vapor Permeability (g/m²/day) | Adhesiveness (%) | Remarks |
|---|---|---|---|---|---|
| 1 | 0 | no | <0.01 | 8 | comparative sample |
| 2 | 10 | no | <0.01 | 63 | sample of the invention |
| 3 | 20 | no | <0.01 | 68 | sample of the invention |
| 4 | 10 | yes | <0.01 | 86 | sample of the invention |
| 5 | 20 | yes | <0.01 | 95 | sample of the invention |

(2-4) Evaluation:

The barrier film substrates of the invention (samples 2 to 5) all had a detection limit of water vapor permeability, less than 0.01 g/m²/day, and were confirmed to have high barrier capability. As compared with that of the comparative barrier film substrate (sample 1), the adhesiveness of the barrier film substrates of the invention (samples 2 to 5) was high. In addition, it was confirmed that the samples having a sulfinyl group-having vinyl monomer content of 20% had higher adhesiveness than those having a sulfinyl group-having vinyl monomer content of 10%. Further, it was also confirmed that the plasma treatment of the organic layer further increases the adhesiveness.

2. Production and Evaluation of Barrier Film Substrate (2):
(1) Production of Barrier Film Substrate:

Barrier film substrates (samples 10 to 34) were produced in the same manner as in the above "Production and Evaluation of Barrier Film Substrate (1)", for which, however, a vinyl monomer having a sulfonyl group and a secondary carbon atom was used. The details of the monomer and the plasma treatment for the organic layer are shown in Table 3.

The plastic film used herein was produced as follows: A resin A having a structure shown below was dissolved in dichloromethane to prepare a solution of the resin having a concentration of 15% by mass, and the solution was cast onto a stainless band according to a die coating method. Next, the first film was peeled away from the band and dried to have a residual solvent concentration of 0.08% by mass. After thus dried, both edges of the first film were trimmed away, and then this was knurled to give a plastic film having a thickness of 100 μm. The glass transition temperature (Tg) of the plastic film was 355° C. (by DMA method).

Resin A:

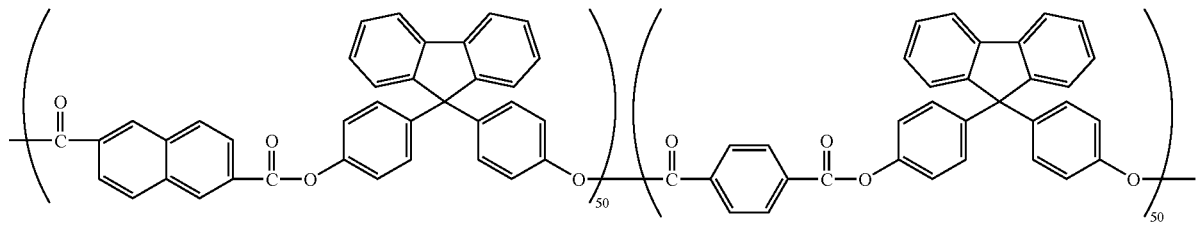

TABLE 3

| Sample No. | Monomer used in organic layer (amount used) | | | Plasma Treatment | Remarks |
|---|---|---|---|---|---|
| 10 | BEPGA (95 mas. %) | PPGMA (5 mas. %) | | no | comparative sample |
| 11 | BEPGA (85.5 mas. %) | PPGMA (4.5 mas. %) | T-1 (10 mas. %) | no | sample of the invention |
| 12 | BEPGA (76 mas. %) | PPGMA (4 mas. %) | T-1 (20 mas. %) | no | sample of the invention |
| 13 | BEPGA (85.5 mas. %) | PPGMA (4.5 mas. %) | T-1 (10 mas. %) | yes | sample of the invention |
| 14 | BEPGA (76 mas. %) | PPGMA (4 mas. %) | T-1 (20 mas. %) | yes | sample of the invention |
| 15 | BEPGA (85.5 mas. %) | PPGMA (4.5 mas. %) | T-2 (10 mas. %) | no | sample of the invention |
| 22 | BEPGA (76 mas. %) | PPGMA (4 mas. %) | T-2 (20 mas. %) | no | sample of the invention |
| 23 | BEPGA (85.5 mas. %) | PPGMA (4.5 mas. %) | T-2 (10 mas. %) | yes | sample of the invention |
| 24 | BEPGA (76 mas. %) | PPGMA (4 mas. %) | T-2 (20 mas. %) | yes | sample of the invention |

TABLE 3-continued

| Sample No. | Monomer used in organic layer (amount used) | | | Plasma Treatment | Remarks |
|---|---|---|---|---|---|
| 31 | BEPGA (85.5 mas. %) | PPGMA (4.5 mas. %) | T-3 (10 mas. %) | no | sample of the invention |
| 32 | BEPGA (76 mas. %) | PPGMA (4 mas. %) | T-3 (20 mas. %) | no | sample of the invention |
| 33 | BEPGA (85.5 mas. %) | PPGMA (4.5 mas. %) | T-3 (10 mas. %) | yes | sample of the invention |
| 34 | BEPGA (76 mas. %) | PPGMA (4 mas. %) | T-3 (20 mas. %) | yes | sample of the invention |

PPGMA $H_2C=CH-COO-(C_3H_6O)_3-CH_3$ (2) Evaluation of Physical Properties of Barrier Film Substrate:

The physical properties of the barrier film substrates (samples 10 to 34) were evaluated according to the methods mentioned below.

(2-1) Water Vapor Permeability:

Determined in the same manner as in the above "Production and Evaluation of Barrier Film Substrate (1)".

(2-2) Probability of Acceptance:

Each sample was analyzed for water vapor permeability at 20 sites; and the site at which the water vapor permeability was over the finite value was considered as a failed site of the gas-barrier laminate film. The probability of the normal site of the 20 tested sites is defined as a probability of acceptance and expressed as percentage.

(3-3) Film Strength:

According to the method of JIS K5600-5-6 (ISO2409) (cross-cut peel method), the film strength of the barrier layer of each sample was determined. The data are the ratio of the area with no broken film (percentage).

(2-4) Results:

The results are shown in Table 4.

TABLE 4

| Sample No. | Water Vapor Permeability (g/m²/day) | Probability of Acceptance | Film Strength | Remarks |
|---|---|---|---|---|
| 10 | <0.01 | 45% | 8% | comparative sample |
| 11 | <0.01 | 52% | 32% | sample of the invention |
| 12 | <0.01 | 56% | 44% | sample of the invention |
| 13 | <0.01 | 78% | 96% | sample of the invention |
| 14 | <0.01 | 83% | 100% | sample of the invention |
| 21 | <0.01 | 57% | 48% | sample of the invention |
| 22 | <0.01 | 62% | 57% | sample of the invention |
| 23 | <0.01 | 88% | 100% | sample of the invention |
| 24 | <0.01 | 92% | 100% | sample of the invention |
| 31 | <0.01 | 68% | 65% | sample of the invention |
| 32 | <0.01 | 72% | 73% | sample of the invention |
| 33 | <0.01 | 98% | 100% | sample of the invention |
| 34 | <0.01 | 100% | 100% | sample of the invention |

(2-5) Evaluation:

The barrier film substrates of the invention (samples 11 to 34) all had a detection limit of water vapor permeability, less than 0.01 g/m²/day, and were confirmed to have high barrier capability. As compared with those of the comparative barrier film substrate (sample 10), the probability of acceptance and the film strength of the barrier film substrates of the invention (samples 11 to 34) were both high. In addition, it was confirmed that the samples having a higher sulfonyl group-having vinyl monomer content had higher probability of acceptance and higher film strength. Further, it was also confirmed that the plasma treatment of the organic layer further increases the probability of acceptance and the film strength.

3. Production and Evaluation of Organic EL Device:

(1) Production of Organic EL Device:

The above-mentioned barrier film substrate (samples 1 to 34) was put into a vacuum chamber; and using an ITO target, a transparent electrode of an ITO thin film having a thickness of 0.2 µm was formed thereon, according to a DC magnetron sputtering method. The ITO film-having barrier film substrate was put into a washing chamber and ultrasonically washed in 2-propanol, and then processed for UV-ozone treatment for 30 minutes. Organic compound layers mentioned below were formed in that order on the substrate (anode), according to a vacuum evaporation method.

(First Hole Transportation Layer)

Copper phthalocyanine: thickness 10 nm.

(Second Hole Transportation Layer)

NPD: thickness 40 nm.

(Light-Emitting Layer Also Serving as Electron Transportation Layer)

Alq: thickness 60 nm

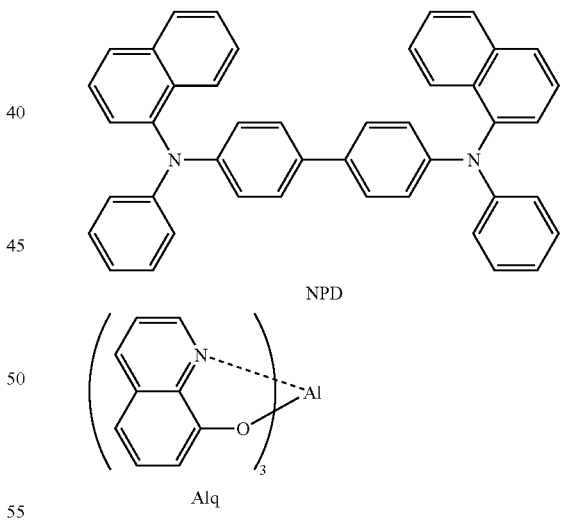

Finally, lithium fluoride (1 nm) and metal aluminium (100 nm) were formed in that order through vapor deposition to form a cathode.

Not exposed to air, this was transferred into a globe box purged with argon gas, and sealed up with a glass sealing can and a UV-curable adhesive (Nagase CIBA's XNR5516HV), thereby producing an organic EL device (samples 101 to 134).

(2) Evaluation of Organic EL Device:

Each organic EL device (samples 101 to 134) was tested and evaluated according to the following methods.

(2-1) Light Emission Test:

Each organic EL device (samples 101 to 134) was driven for light emission with a voltage of 9 V applied thereto. Every device emitted green light derived from Alq.

(2-2) Wet Heat Storability:

Each organic EL device (samples 101 to 134) was stored under the condition of 60° C. and a relative humidity of 90% for 3 days, and then driven for light emission with a voltage of 9V applied thereto. The light-emitting surface was observed with a microscope. Samples 101 and 110 gave dark spots. On the other hand, samples 101 to 105, and 111 to 134 gave no dark spot.

(2-3) Evaluation:

The above results confirm that the organic EL devices comprising any of the barrier film substrates of the invention (samples 2 to 5, 11 to 34) all emitted good light, and their barrier capability, adhesiveness and wet heat storability were all good.

In the barrier film substrate of the invention, the barrier layer has good adhesiveness, and has low water vapor permeability. According to the production method of the invention, the barrier film substrate can be readily produced. Accordingly, the barrier film substrate of the invention is useful as a substituent for conventional glass substrates, and is applicable to a wide variety of industrial products such as typically organic EL devices.

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 193293/2007 filed on Jul. 25, 2007, which is expressly incorporated herein by reference in its entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A method for producing a barrier film substrate having, on at least one surface of a plastic film, a barrier layer that contains at least one inorganic layer and at least one organic layer, which includes a step of forming the organic layer by polymerization of a monomer mixture containing a vinyl monomer represented by the following formula (1):

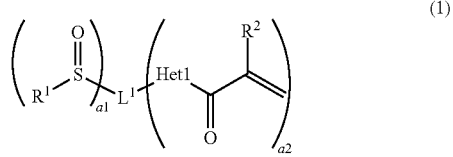

(1)

wherein $R^1$ represents an alkyl group, an aryl group, an aralkyl group or an alkylaryl group; $R^2$ represents a hydrogen atom or an alkyl group; $L^1$ represents a linking group; Het1 represents an oxygen atom or an imino group; a1 and a2 each independently indicate an integer of from 1 to 4; provided that the compound of formula (1) contains a secondary carbon atom in $R^1$ or $L^1$.

2. The method for producing a barrier film substrate according to claim 1, wherein Het1 in formula (1) is an oxygen atom.

3. The method for producing a barrier film substrate according to claim 1, wherein $R^2$ in formula (1) is a hydrogen atom.

4. The method for producing a barrier film substrate according to claim 1, wherein the monomer mixture further contains a vinyl monomer is represented by the following formula (2):

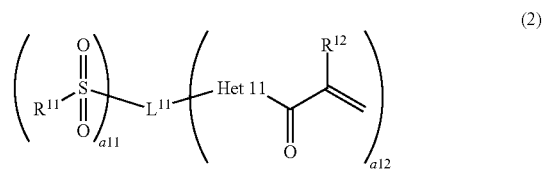

(2)

wherein $R^{11}$ represents an alkyl group, an aryl group, an aralkyl group or an alkylaryl group; $R^{12}$ represents a hydrogen atom or an alkyl group; $L^{11}$ represents a linking group; Het11 represents an oxygen atom or an imino group; a11 and a12 each independently indicate an integer of from 1 to 4; provided that the compound of formula (2) contains a secondary carbon atom in $R^{11}$ or $L^{11}$.

5. The method for producing a barrier film substrate according to claim 4, wherein in formula (2), at least one secondary carbon atom is positioned at the α-position or β-position relative to the sulfonyl group.

6. The method for producing a barrier film substrate according to claim 4, wherein Het11 in formula (2) is an oxygen atom.

7. The method for producing a barrier film substrate according to claim 4, wherein $R^{11}$ in formula (2) is an alkyl group or an aryl group.

8. The method for producing a barrier film substrate according to claim 4, wherein $R^{12}$ in formula (2) is a hydrogen atom.

9. The method for producing a barrier film substrate according to claim 1, wherein the monomer mixture contains the vinyl monomer of formula (1) in an amount of from 1 to 80% by weight.

10. The method for producing a barrier film substrate according to claim 1, wherein the inorganic layer is formed on the organic layer so that it is in contact with the organic layer.

11. The method for producing a barrier film substrate according to claim 10, wherein the inorganic layer is formed after plasma treatment of the surface of the organic layer.

* * * * *